(12) United States Patent
Hou

(10) Patent No.: US 12,127,442 B2
(45) Date of Patent: *Oct. 22, 2024

(54) PIXEL DEFINING STRUCTURE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/213,902

(22) Filed: Jun. 26, 2023

(65) Prior Publication Data

US 2023/0337472 A1    Oct. 19, 2023

Related U.S. Application Data

(63) Continuation of application No. 16/476,852, filed as application No. PCT/CN2019/070700 on Jan. 7, 2019, now Pat. No. 11,744,113.

(30) Foreign Application Priority Data

May 11, 2018   (CN) .......................... 201810450329.6

(51) Int. Cl.
*H10K 59/122*   (2023.01)
*H10K 71/00*    (2023.01)
(Continued)

(52) U.S. Cl.
CPC .......... *H10K 59/122* (2023.02); *H10K 71/00* (2023.02); *H10K 71/233* (2023.02); *H10K 59/1201* (2023.02); *H10K 2102/351* (2023.02)

(58) Field of Classification Search
None
See application file for complete search history.

(56) References Cited

U.S. PATENT DOCUMENTS 9,818,811 B2    11/2017   Shin et al.
11,744,113 B2*  8/2023    Hou ...................... H10K 71/233
                                                            257/40
(Continued)

FOREIGN PATENT DOCUMENTS

CN        103779380 A    5/2014
CN        105826358 A    8/2016
(Continued)

OTHER PUBLICATIONS

Chinese Office Action dated Mar. 20, 2020, from application No. 201810450329.6.
(Continued)

*Primary Examiner* — Michelle Mandala
(74) *Attorney, Agent, or Firm* — XSENSUS LLP

(57) ABSTRACT

A pixel defining structure includes a first sub-pixel defining structure surrounding a first sub-pixel region configured to form a first sub-pixel having a first color. The first sub-pixel defining structure includes a lyophilic portion one the bottom side of the first sub-pixel region and a lyophobic portion on a side opposite to the bottom side. The pixel defining structure includes a second sub-pixel defining structure surrounding a second sub-pixel region configured to form a second sub-pixel having a second color. The second sub-pixel defining structure includes a lyophilic portion one the bottom side of the second sub-pixel region and a lyophobic portion on a side opposite to the bottom side. The second color is different from the first color. Thicknesses of the (Continued)

lyophilic portion of the first sub-pixel defining structure and the lyophilic portion of the second sub-pixel defining structure are different.

10 Claims, 5 Drawing Sheets

(51) Int. Cl.
*H10K 71/20* (2023.01)
*H10K 59/12* (2023.01)
*H10K 102/00* (2023.01)

(56) References Cited

U.S. PATENT DOCUMENTS

| | | |
|---|---|---|
| 2014/0091285 A1 | 4/2014 | Shin et al. |
| 2015/0303243 A1 | 10/2015 | Shin et al. |
| 2015/0333110 A1 | 11/2015 | Park et al. |
| 2016/0111688 A1 | 4/2016 | Lee |
| 2016/0284776 A1 | 9/2016 | Kim |
| 2019/0006612 A1 | 1/2019 | Zhang et al. |
| 2019/0305059 A1 | 10/2019 | Hou |

FOREIGN PATENT DOCUMENTS

| | | |
|---|---|---|
| CN | 106373982 A | 2/2017 |
| CN | 107248523 A | 10/2017 |
| CN | 107731871 A | 2/2018 |
| CN | 107819080 A | 3/2018 |
| CN | 207134357 U | 3/2018 |
| CN | 107887423 A | 4/2018 |
| CN | 207250517 U | 4/2018 |
| CN | 108630734 A | 10/2018 |
| CN | 105826358 B | 2/2019 |

OTHER PUBLICATIONS

International Search Report and Written Opinion dated Mar. 28, 2019, from application No. PCT/CN2019/070700.
Non-Final Office Action mailed Aug. 26, 2022, for U.S. Appl. No. 16/476,852, filed Jul. 9, 2020, 12 pages.
Final Rejection mailed Feb. 6, 2023, for U.S. Appl. No. 16/476,852, filed Jul. 9, 2020, 9 pages.
Notice of Allowance mailed Apr. 13, 2023, for U.S. Appl. No. 16/476,852, filed Jul. 9, 2020, 18 pages.
Notice of Allowance mailed on Oct. 12, 2020, received for CN Application 201810450329.6, 4 pages including English Translation.

* cited by examiner

PIXEL DEFINING STRUCTURE AND MANUFACTURING METHOD THEREOF, DISPLAY PANEL AND DISPLAY DEVICE

CROSS-REFERENCE TO RELATED APPLICATIONS

The present application is a continuation application of U.S. application Ser. No. 16/476,852, filed on Jul. 9, 2020, which is the national phase of PCT Application No. PCT/CN2019/070700, filed on Jan. 7, 2019, is based upon and claims priority to Chinese Patent Application No. 201810450329.6, filed on May 11, 2018, the entire contents of each are incorporated herein by reference for all purposes.

TECHNICAL FIELD

The present disclosure relates to the field of display technologies, and more particularly, to a pixel defining structure and a manufacturing method thereof, and a display panel and a display device.

BACKGROUND

An organic electroluminescent device (OLED) has advantages of self-luminescence, fast response, wide viewing angle, high brightness, bright color, light weight, and thin thickness with respect to a LCD, and is considered as a next-generation display technology. The OLED generally includes a structure in which an anode layer, a hole transport layer, a hole injection layer, a pixel defining layer, an electron injecting layer, an electron transporting layer, a cathode layer, and the like are sequentially formed on a substrate.

The thickness uniformity of the pixel defining layer has a large influence on the display quality. Therefore, various efforts still need to be made to improve the thickness uniformity of the pixel defining layer.

SUMMARY

The disclosure is intended to provide a simplified summary of the disclosure of the present disclosure, in order to provide a basic understanding of the disclosure. The content of the present disclosure is not a complete description of the disclosure of the present application, and is not intended to identify important/critical elements of the embodiments of the present application, nor is it intended to define the scope that the application claims.

The present disclosure provides a pixel defining structure and a manufacturing method thereof, and a display panel and a display device.

In one aspect of the present disclosure, there is provided a pixel defining structure, formed on a substrate and for defining a plurality of sub-pixels. The pixel defining structure includes a first sub-pixel defining structure surrounding a first sub-pixel region. The first sub-pixel region has a first color, the first sub-pixel defining structure includes a lyophilic portion and a lyophobic portion, and the lyophobic portion of the first sub-pixel defining structure is further away from the substrate than the lyophilic portion of the first sub-pixel defining structure. The pixel defining structure includes a second sub-pixel defining structure surrounding a second sub-pixel region. The second sub-pixel region has a second color, the second sub-pixel defining structure includes a lyophilic portion and a lyophobic portion, and the lyophobic portion of the second sub-pixel defining structure is further away from the substrate than the lyophilic portion of the second sub-pixel defining structure. The second color is different from the first color. The lyophilic portion of the first sub-pixel defining structure and the lyophilic portion of the second sub-pixel defining structure have different thicknesses.

According to one arrangement, the area of the bottom of the first sub-pixel region is smaller than the area of the bottom of the second sub-pixel region, and the thickness of the lyophilic portion of the first sub-pixel defining structure is smaller than the thickness of the lyophilic portion of the second sub-pixel defining structure.

According to one arrangement, the pixel defining structure can further include a third sub-pixel defining structure surrounding a third sub-pixel region. The third sub-pixel region has a third color, the third sub-pixel defining structure includes a lyophilic portion and a lyophobic portion, the lyophobic portion of the third sub-pixel defining structure is further from the substrate than the lyophilic portion of the third sub-pixel defining structure. The third color is different from the first color and the second color, and the lyophilic portions of the first, second, and third sub-pixel defining structures have different thicknesses.

According to an arrangement, the area of the bottom of the second sub-pixel region is smaller than the area of the bottom of the third sub-pixel region, and the thickness of the lyophilic portion of the second sub-pixel defining structure is smaller than the thickness of the lyophilic portion of the third sub-pixel defining structure.

According to an arrangement, each of the sub-pixel defining structures can have the same height. In one arrangement, the sidewall surface of each of the sub-pixel defining structures can be subject to surface processing, such that a sidewall surface of a portion of each of the sub-pixel defining structures located on a bottom side of the corresponding sub-pixel region has lyophilicity, to form a corresponding lyophilic portion, and a sidewall surface of a portion of each of the sub-pixel defining structures located on a side opposite to the bottom side of the corresponding sub-pixel region has lyophobicity, to form a corresponding lyophobic portion. In one arrangement, each of the sub-pixel defining structures can be made of a lyophilic material, and a sidewall surface of a portion of each of the sub-pixel defining structures located on a side opposite to the bottom side of the corresponding sub-pixel region can be subjected to hydrophobic treatment, to form a corresponding lyophobic portion. In another arrangement, each of the sub-pixel defining structures may be made of a lyophobic material, and a sidewall surface of a portion of each of the sub-pixel defining structures located on a bottom side of the corresponding sub-pixel region has lyophilicity, to form a corresponding lyophilic portion.

According to one arrangement, a height of the first sub-pixel defining structure can be smaller than a height of the second sub-pixel defining structure, and a height of the second sub-pixel defining structure can be smaller than a height of the third sub-pixel defining structure. In one arrangement, the entire pixel defining structure can be made of a material including a lyophilic material and a lyophobic material. The sub-pixel defining structure of each color can use the same material including a lyophilic material and a lyophobic material, or a bifunctional material, such that each sub-pixel defining structure has the same ratio of the thickness of lyophilic portion against the thickness of the lyophobic portion.

In another aspect of the present disclosure, there is provided a method for manufacturing a pixel defining structure. The manufacturing method includes forming a first sub-pixel defining structure surrounding a first sub-pixel region and a second sub-pixel defining structure surrounding a second sub-pixel region on one surface of a substrate. The first sub-pixel region has a first color, the first sub-pixel defining structure includes a lyophilic portion and a lyophobic portion, the lyophobic portion of the first sub-pixel defining structure is further away from the substrate than the lyophilic portion of the first sub-pixel defining structure, the second sub-pixel region has a second color, the second sub-pixel defining structure includes a lyophilic portion and a lyophobic portion, the lyophobic portion of the second sub-pixel defining structure is further away from the substrate than the lyophilic portion of the second sub-pixel defining structure. The second color is different from the first color. The lyophilic portion of the first sub-pixel defining structure and the lyophilic portion of the second sub-pixel defining structure have different thicknesses.

According to one arrangement, the area of the bottom of the first sub-pixel region is smaller than the area of the bottom of the second sub-pixel region, and the thickness of the lyophilic portion of the first sub-pixel defining structure is smaller than the thickness of the lyophilic portion of the second sub-pixel defining structure.

According to one arrangement, forming a first sub-pixel defining structure surrounding a first sub-pixel region and a second sub-pixel defining structure surrounding a second sub-pixel region on one surface of a substrate can include: coating a first photoresist including a lyophilic material and a lyophobic material on said surface of the substrate, to cover the first sub-pixel region and the second sub-pixel region; performing lithography and etching on the first photoresist to form the first sub-pixel defining structure surrounding the first sub-pixel region; coating a second photoresist including a lyophilic material and a lyophobic material on said surface of the substrate, to cover the second sub-pixel region, the thickness of the second photoresist is larger than the thickness of the first photoresist; and performing lithography and etching on the second photoresist to form the second sub-pixel defining structure surrounding the second sub-pixel region.

According to one arrangement, forming a first sub-pixel defining structure surrounding a first sub-pixel region and a second sub-pixel defining structure surrounding a second sub-pixel region on one surface of a substrate can include: coating a first photoresist including a lyophilic material and a lyophobic material on said surface of the substrate, to cover the first sub-pixel region and the second sub-pixel region; performing lithography and etching on the first photoresist to form the second sub-pixel defining structure surrounding the second sub-pixel region; coating a second photoresist including a lyophilic material and a lyophobic material on said surface of the substrate, to cover the first sub-pixel region, the thickness of the second photoresist is smaller than the thickness of the photoresist; and performing lithography and etching on the first photoresist to form the first sub-pixel defining structure surrounding the second sub-pixel region.

According to one arrangement, forming a first sub-pixel defining structure surrounding a first sub-pixel region and a second sub-pixel defining structure surrounding a second sub-pixel region on one surface of a substrate can include: coating a photoresist on said surface of the substrate, to cover the first sub-pixel region and the second sub-pixel region; performing lithography and etching on the photoresist to form the first sub-pixel defining structure and the second sub-pixel defining structure of the same thickness; performing surface processing on the surface of the sidewall of the first sub-pixel defining structure, such that the portion of the first sub-pixel defining structure close to the substrate has a lyophilic sidewall surface, to form a lyophilic portion of the first sub-pixel defining structure, and the portion of the first sub-pixel defining structure far away from the substrate has a lyophobic sidewall surface, to form a lyophobic portion of the first sub-pixel defining structure; and performing surface processing on the surface of the sidewall of the second sub-pixel defining structure, such that the portion of the second sub-pixel defining structure close to the substrate has a lyophilic sidewall surface, to form a lyophilic portion of the second sub-pixel defining structure, and the portion of the second sub-pixel defining structure far away from the substrate has a lyophobic sidewall surface, to form a lyophobic portion of the second sub-pixel defining structure.

According to one arrangement, there is provided a display panel. The display panel includes a substrate and a pixel defining structure described above, forming on one surface of the substrate. A first sub-pixel driving structure for driving a first sub-pixel and a second sub-pixel driving structure for driving a second sub-pixel are formed on said surface of the substrate, and the first sub-pixel driving structure and the second sub-pixel driving structure respectively form the bottom of the first sub-pixel region and the bottom of the second sub-pixel region, each of which includes the pixel defining structure described above.

According to one arrangement, the display panel may be an organic electroluminescent display panel, and the first and second sub-pixel regions (and the third sub-pixel region) can be filled with inks of the first color and the second color (and the third color), respectively.

In another aspect of the present disclosure, there is provided a display device including the display panel described above.

According to the pixel defining structure of the present disclosure and the manufacturing method thereof, and the display panel and the display device including the pixel defining structure, the inconsistence of the thickness of the pixel films can be improved.

BRIEF DESCRIPTION OF THE DRAWINGS

The accompanying drawings herein are incorporated in and constitute a part of this specification, illustrate arrangements conforming to the present disclosure and together with the description serve to explain the principles of the present disclosure.

DETAILED DESCRIPTION

Figure 1:
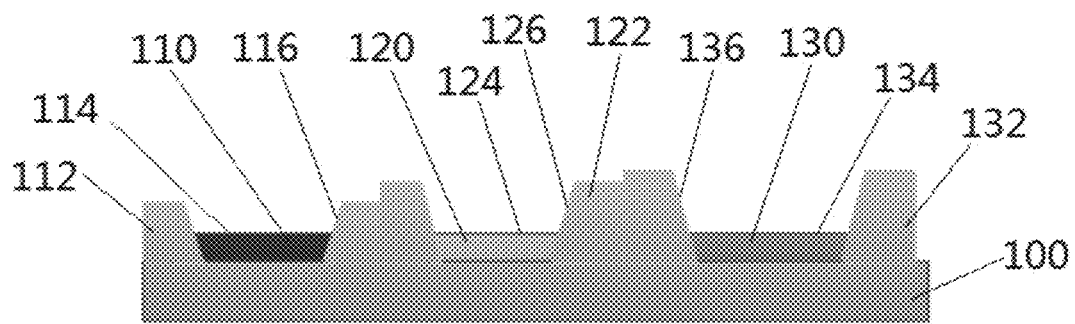
FIG. 1 is a schematic cross-sectional view of a pixel defining structure according to an arrangement of the present disclosure.

Exemplary arrangements will be described more comprehensively by referring to accompanying drawings now. However, the exemplary arrangements can be embodied in many forms and should not be construed as limited to the arrangements set forth herein; rather, these arrangements are provided so that this disclosure will be made thorough and complete, and the concept of exemplary arrangements will be fully conveyed to those skilled in the art.

The accompanying drawings of the present application are merely schematic. The sizes of the various structures or features shown in the drawings are exaggerated and are not intended to be drawn to scale, in order to clearly explain the principles of the present disclosure.

The same reference numerals in the drawings denote the same or similar parts, and the repeated description of the same or similar parts will be omitted.

It should be noted that the orientation terms used in describing the arrangements disclosed herein, such as "upper", "lower", etc., are merely referring to the orientations shown in the drawings and do not represent the orientations in the actual application environment.

In the present application, the noun itself does not represent or imply a specific number unless otherwise specifically stated. That is, it may be one or two or more. The quantitative word "multiple" refers to more than two. The "above" used in conjunction with a number indicates a range including the number per se.

In the present application, the ordinal numerals "first", "second", "third" and the like before an element are merely for distinguishing the same kind of elements in the description, and have no limitation in terms of structure or order.

As a core structure of an organic electroluminescent device (OLED), a pixel defining structure is for defining sub-pixels of a display device, and its quality has a direct influence on the display quality of the OLED. The method for forming the pixel defining structure mainly includes vacuum evaporation and solution processing. Vacuum evaporation is suitable for small organic molecules. The film formation is uniform and the technology is relatively mature. However, the equipment investment is large, the material utilization rate is low, and an alignment accuracy of a large-size product mask is low. The solution processing includes spin coating, inkjet printing, nozzle coating, and the like. It is suitable for polymer materials and soluble small molecules. It is characterized by low equipment cost and has outstanding improvements in large-scale and large-size production.

When forming sub-pixels by inkjet printing, the sub-pixels are defined by sub-pixel regions. The bottom of the sub-pixel region is generally formed by a sub-pixel driving structure. The bottom of the sub-pixel region includes, for example, an anode layer, a hole transport layer, and a hole injection layer which are stacked on a substrate. The surface material of the sub-pixel driving structure is either lyophilic per se or formed with a lyophilic coating. Thus, the bottom of the sub-pixel region has lyophilicity.

The pixel defining structure includes a plurality of sub-pixel defining structures that surround sub-pixel regions for forming sub-pixels of various colors. Ink of a corresponding color is filled in the corresponding sub-pixel region to form a sub-pixel film of the corresponding color. Currently, a pixel defining structural material is bifunctional materials, including lyophilic materials such as silicon oxide or silicon nitride, and lyophobic materials such as fluoropolyimide, and fluorine-containing polymethyl methacrylate. During the film formation process, the lyophobic material will float on top, while the lyophilic material will sink below. Therefore, after the bifunctional material is subjected to processes such as coating, exposure, development, post-baking, etc., sub-pixel defining structures of various colors having the same thickness can be formed at one time. The sub-pixel defining structure includes a lyophilic portion on the bottom side of the sub-pixel region (close to the bottom of the sub-pixel region) and a lyophobic portion on the side opposite to the bottom of the sub-pixel region (far away from the bottom of the sub-pixel region).

In the present application, "thickness" refers to the corresponding height or distance measured in a direction perpendicular to the surface of the substrate on which the pixel defining structure is located or perpendicular to the bottom of the sub-pixel region.

In the present application, a "sidewall" of a sub-pixel defining structure refers to a wall of a sub-pixel defining structure that faces or contacts ink.

In the present application, "lyophilic" and "lyophobic" may be used interchangeably with "hydrophilic" and "hydrophobic" to describe a surface property or a wetting property of a material with respect to liquid when being in contact with a liquid.

When the ink is dropped into the sub-pixel region by the inkjet printing process, the ink droplet first diffuses due to the lyophilicity at the bottom of the sub-pixel region and spreads across the bottom of the sub-pixel region. Then, since the portion of the sub-pixel defining structure close to the bottom of the sub-pixel region has lyophilicity and climbs along the sidewall of the sub-pixel defining structure. The portion of the sub-pixel defining structure far away from the bottom of the pixel region suppresses the climbing of the ink due to its lyophobicity, thus preventing the ink from overflowing the sub-pixel region.

In addition, pixels in the related art generally include a red sub-pixel, a green sub-pixel, and a blue sub-pixel. These sub-pixels are formed by filling ink of a corresponding color into a sub-pixel region. At present, under the same application conditions, blue ink has the shortest life, green ink has the second shortest life, and red ink has the longest life. In order to make the red, green and blue sub-pixels have substantially the same service life, the areas of the red, green and blue sub-pixel regions are designed to be different. That is, the bottom area of the blue sub-pixel region is the largest, the bottom area of the green sub-pixel region is the second largest, and the bottom area of the red sub-pixel region has the smallest area. Since the blue sub-pixel film has the largest area/volume, the current density flowing through the blue sub-pixel is reduced, which can reduce the influence on the blue sub-pixel, and prolong the lifetime of the blue sub-pixel. Thus, by designing sub-pixels of different colors to be different in size, the red, green, and blue sub-pixels can have substantially the same lifetime.

Since the bottom areas of the blue, green, and red sub-pixel regions are smaller one than another in this order, the time length required for the blue ink droplet to spread across the bottom of the sub-pixel region is the longest, the time length required for the green ink droplet to spread across the bottom of the sub-pixel region is the second longest, and the time length required for the red ink droplet to spread across the bottom of the sub-pixel region is the shortest. Meanwhile, since the sub-pixel defining structures of the blue, green, and red sub-pixels are made of the same material through the same process, the interface of the lyophilic portion and the lyophobic portion of each sub-pixel defining structure is substantially at a portion of the same thickness. In other words, each lyophilic portion has the substantially same thickness. Therefore, time lengths required for the blue, green, and red inks to climb the sidewalls of the respective sub-pixel defining structures are substantially the same. As a result, the time length for the blue ink from being dropped on the bottom of the sub-pixel region to stopping climbing is the longest, the time length for the green ink from being dropped on the bottom of the sub-pixel region to stopping climbing is the second longest, and the time length for the red ink from being dropped on the bottom of the sub-pixel region to stopping climbing is the shortest. Therefore, under the same film formation conditions, the red ink can form a desired film thickness, but the green ink, particularly the blue ink, may have a film thickness lower than a desired value, resulting in inconsistent film thicknesses of the sub-pixels for different colors.

The pixel defining structure and the method for manufacturing the same, and the display panel and the display device including the pixel defining structure according to the present disclosure can overcome the above problem of inconsistent thicknesses of the sub-pixel films due to the difference in size of the sub-pixels.

FIG. 1 is a schematic cross-sectional view of a pixel defining structure according to an arrangement of the present disclosure. In the arrangement shown in FIG. 1, the pixel defining structure is configured to define sub-pixels of three colors of red, green, and blue.

However, it should be understood by those skilled in the art that the present disclosure is not limited to the case of three color sub-pixels as described in this particular arrangement. The pixel defining structure may also define two color sub-pixels, or four or more sub-pixels.

It should also be understood by those skilled in the art that in the following description of the exemplary arrangements, as an example for illustration the principle of the present disclosure, an organic electroluminescent device manufactured by the inkjet printing method includes a pixel defining structure of red, green, and blue sub-pixels. However, it should be understood by those skilled in the art that the pixel defining structure of the present disclosure and its manufacturing method can also be applied to pixel defining structures used by other display devices having similar problems, and/or including pixel defining structure including other color sub-pixels.

The pixel defining structure shown in FIG. 1 is formed on the substrate 100. The substrate 100 may be formed of a transparent material such as glass or polyimide. Sub-pixel driving structures 110 for driving red sub-pixels, sub-pixel driving structures 120 for driving green sub-pixels, and sub-pixel driving structures 130 for driving green sub-pixels can be formed on the substrate 100 by various film forming processes such as deposition, evaporation, sputtering, coating, etc., which are well known to those skilled in the art. In the case of an OLED display device, the sub-pixel driving structure can include, for example, an anode layer, a hole transport layer, and a hole injection layer. It should be understood by those skilled in the art that in order to drive sub-pixel to emit light, another part of sub-pixel driving structure including an electron injection layer, an electron transport layer, a cathode layer, and the like should be formed on the pixel defining structure.

The improvements made by the present disclosure to the related art do not relate to the substrate and sub-pixel driving structures described above. The substrate and sub-pixel driving structure in the related art can be used together with the present disclosure.

In the exemplary arrangement shown in FIG. 1, the pixel defining structure includes three sub-pixel defining structures respectively surrounding a red sub-pixel region (first sub-pixel region) for forming a red (first color) sub-pixel, a green sub-pixel region (second sub-pixel region) for forming a green (second color) sub-pixel, and a blue sub-pixel region (third sub-pixel region) for forming a blue (third color) sub-pixel. These sub-pixel regions each include a bottom of the sub-pixel region.

A first sub-pixel defining structure 112 is raised around the bottom 114 of the first sub-pixel region to form a first sub-pixel region (red sub-pixel region). The first sub-pixel driving structure 110 for driving the red sub-pixels forms the bottom 114 of the first sub-pixel region. The surface material of the first pixel driving structure 110 is either lyophilic per se or formed with a lyophilic coating. Therefore, the bottom 114 of the first sub-pixel region has lyophilicity.

In an exemplary arrangement, the first sub-pixel defining structure 112 can be made of a bi-functional material as in the related art. Such bifunctional materials include, for example, lyophilic materials such as silicon oxide or silicon nitride, and lyophobic organic materials such as fluoropolyimide and fluorine-containing polymethyl methacrylate. During the film formation process, the lyophobic material will float on top, while the lyophilic material will sink below. Therefore, in the sub-pixel defining structure formed by the bifunctional material after the processes such as coating, exposure, development, post-baking, etc., a portion of the first sub-pixel defining structure 112 close to the bottom 114 of the first sub-pixel region, that is, a portion close to the substrate 100 has lyophilicity to form a lyophilic portion, and a portion of the first sub-pixel defining structure 112 far away from the bottom 114 of the first sub-pixel region, that is, a portion far away from the substrate 100 is lyophobic to form a lyophobic portion.

In another arrangement, a surface of a first sidewall 116 of the first sub-pixel defining structure 112 made of a lyophilic material can be subjected to a hydrophobic treatment to make a sidewall portion of the first sidewall 116 far away from the bottom 114 of the first sub-pixel region to be lyophobic, thereby forming a lyophilic portion close to the bottom of the sub-pixel region and a lyophobic portion far away from the bottom of the sub-pixel region.

In another arrangement, the surface of the first sidewall 116 of the first sub-pixel defining structure 112 made of a lyophobic material can be subjected to a hydrophilic treatment to make a sidewall portion of the first sidewall 116 close to the bottom 114 of the first sub-pixel region to be lyophilic, thereby forming a lyophilic portion close to the bottom of the sub-pixel region and a lyophobic portion far away from the bottom of the sub-pixel region.

A second sub-pixel defining structure (green sub-pixel defining structure) is similar to the first sub-pixel defining structure, and is raised around the bottom 124 of the second sub-pixel region to form a second sub-pixel region. The second sub-pixel driving structure 120 for driving the green sub-pixels forms the bottom 124 of the second sub-pixel region. The bottom 124 of the second sub-pixel region has lyophilicity. A portion of the second sub-pixel defining structure 122 close to the bottom 124 of the second sub-pixel region (or the corresponding sidewall portion of the second sidewall 126), that is, a portion close to the substrate 100, has lyophilicity to form a lyophilic portion. A portion far away from the bottom 124 of the second sub-pixel region (or the corresponding sidewall portion of the second sidewall 126), that is, a portion far away from the substrate 100, is lyophobic to form a lyophobic portion.

Similarly, a third sub-pixel defining structure 132 is raised around the bottom 134 of the third sub-pixel region to form a third sub-pixel region (blue sub-pixel region). The third sub-pixel driving structure 130 for driving the red sub-pixels forms the bottom 134 of the third sub-pixel region. The bottom 134 of the third sub-pixel region has lyophilicity. A portion of the third sub-pixel defining structure 132 close to the bottom 134 of the third sub-pixel region (or a corresponding sidewall portion of the third sidewall 136) has lyophilicity to form a lyophilic portion, and a portion of the third sub-pixel defining structure 132 far away from the bottom 134 of the third sub-pixel region (or a corresponding sidewall portion of the third sidewall 136) is lyophobic to form a lyophobic portion.

In the exemplary arrangement, since the lifetimes of the red ink, the green ink, and the blue ink for forming the red, green, and blue sub-pixels are shorter one than another in this order under the same application conditions, in order to make the sub-pixels of the three colors have substantially the same lifetime, the size of the red sub-pixel region (first sub-pixel region) is made the smallest, the size of the green sub-pixel region (second sub-pixel region) is made the second, and the blue sub-pixel region (the third sub-pixel region) is made the largest. Correspondingly, the area of the bottom 114 of the first sub-pixel region is smaller than the area of the bottom 124 of the second sub-pixel region, and the area of the bottom 124 of the second sub-pixel region is smaller than the area of the bottom 134 of the third sub-pixel region.

According to the present disclosure, the thickness of the first sub-pixel defining structure 112 of the first (red) sub-pixel region can be smaller than the thickness of the second sub-pixel defining structure 122 of the second (green) sub-pixel region, and the thickness of the second sub-pixel defining structure of the second (green) sub-pixel region can be smaller than the thickness of the third sub-pixel defining structure 132 of the third (blue) sub-pixel region.

According to this exemplary arrangement of the present disclosure, since the thickness of the first sub-pixel defining structure is smaller than the thickness of the second sub-pixel defining structure, and the thickness of the second sub-pixel defining structure is smaller than the thickness of the third sub-pixel defining structure, it can be known from the related art of forming a sub-pixel defining structure with a bifunctional material, the thickness of the lyophilic portion of the first sub-pixel defining structure is smaller than the thickness of the lyophilic portion of the second sub-pixel defining structure, and the thickness of the lyophilic portion of the second sub-pixel defining structure is smaller than the thickness of the lyophilic portion of the third sub-pixel defining structure. In this case, in order to form a predetermined film thickness or to make the inks climb the same thickness along the sidewalls of the sub-pixel defining structures, the time length required for the ink to climb along the sidewall of the first sub-pixel defining structure is longer than the time length required for the ink to climb along the sidewall of the second sub-pixel defining structure, and the time length required for the ink to climb along the sidewall of the second sub-pixel defining structure is longer than the time length required for the ink to climb along the sidewall of the third sub-pixel defining structure.

Meanwhile, since the bottom area of the sub-pixel region of the first sub-pixel region is smaller than the bottom area of the sub-pixel region of the second sub-pixel region, and the bottom area of the sub-pixel region of the second sub-pixel region is smaller than the bottom area of the sub-pixel region of the third sub-pixel region, the time length required for the ink droplet to spread across the bottom of the first sub-pixel region is shorter than the time length required for the ink droplet to spread across the bottom of the second sub-pixel region, and the time length required for the ink droplet to spread across the bottom of the second sub-pixel region is shorter than the time length required for the ink droplet to spread across the bottom of the third sub-pixel region.

Thus, according to this exemplary arrangement of the present disclosure, the size of each color sub-pixel region can be adjusted such that for the sub-pixel regions of the three colors, the time lengths from the ink droplets being dropped onto the bottoms of the sub-pixel regions to the formation of the sub-pixel films of the predetermined thickness are substantially the same. That is to say, under the same film formation conditions, sub-pixel films of different colors having the same thickness can be formed in the sub-pixel regions of the three different colors.

It should be understood by those skilled in the art that if inks of two colors are substantially the same in service life, the sizes of the corresponding sub-pixel regions are substantially the same, and the areas of the bottoms of the sub-pixel regions of the corresponding sub-pixel regions are substantially the same. Thus, the thicknesses of the sub-pixel defining structures of corresponding sub-pixel regions are also substantially the same.

It should also be understood by those skilled in the art that if, for example, the lifetime of the red ink is shorter than the lifetime of the blue ink, the size of the red sub-pixel region can be made larger than the size of the blue sub-pixel region, and the thickness of the sub-pixel defining structure of the red sub-pixel region can be made larger than the thickness of the sub-pixel defining structure of the blue sub-pixel region.

The present disclosure is equally applicable to other color combinations than red-green-blue.

More generally, the pixel defining structure provided by the present disclosure includes: a first sub-pixel defining structure surrounding a first sub-pixel region. The first sub-pixel region has a first color, the first sub-pixel defining structure includes a lyophilic portion and a lyophobic portion, and the lyophobic portion of the first sub-pixel defining structure is further away from the substrate than the lyophilic portion of the first sub-pixel defining structure; a second sub-pixel defining structure surrounding a second sub-pixel region. The second sub-pixel region has a second color, the second sub-pixel defining structure includes a lyophilic portion and a lyophobic portion, and the lyophobic portion of the second sub-pixel defining structure is further away from the substrate than the lyophilic portion of the second sub-pixel defining structure. The second color is different from the first color, and the lyophilic portion of the first sub-pixel defining structure and the lyophilic portion of the second sub-pixel defining structure have different thicknesses.

Figure 2A:
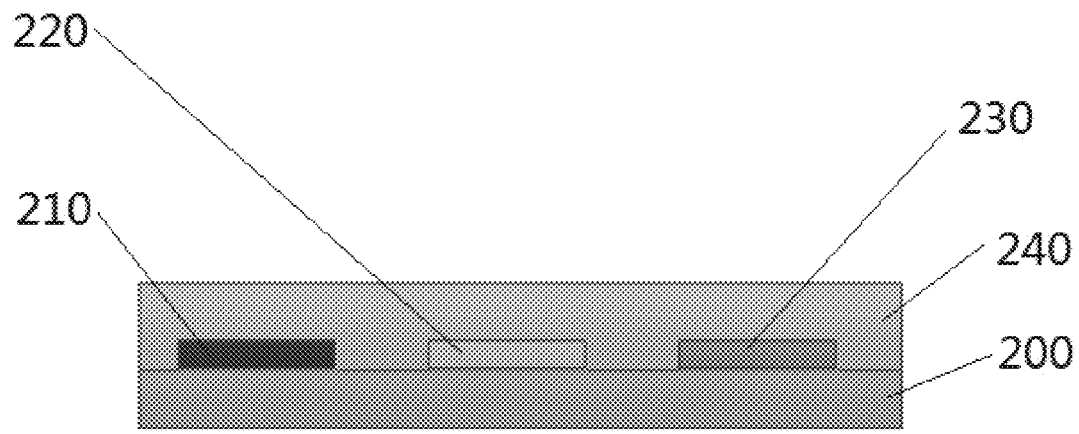
FIGS. 2A-2F are schematic cross-sectional views of pixel defining structures at various stages in a manufacturing process of a pixel defining structure according to an arrangement of the present disclosure.
Figure 2B:
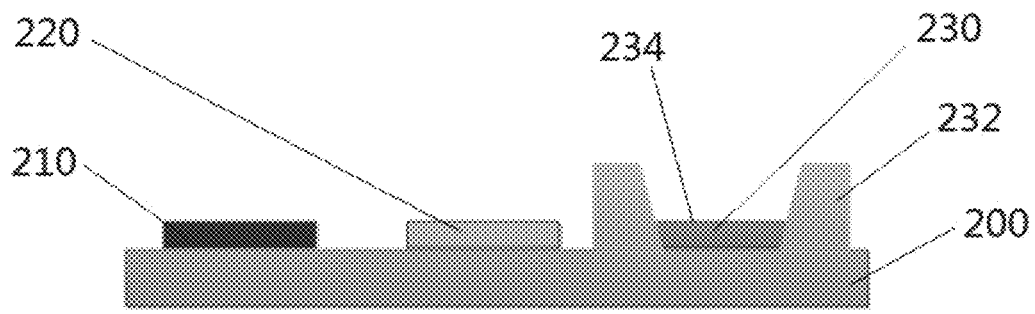
Figure 2C:
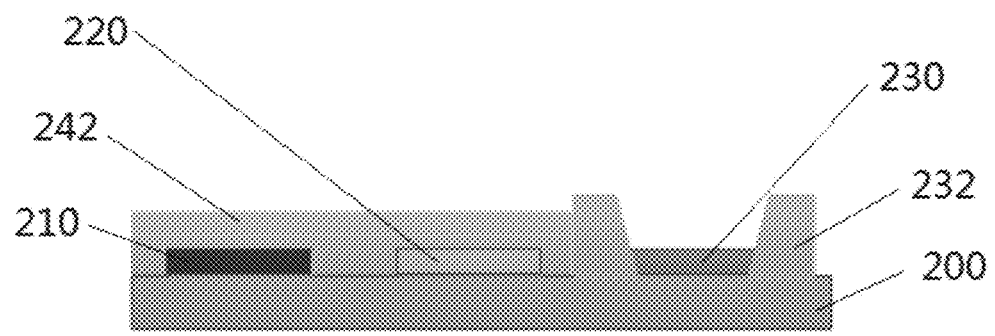
Figure 2D:
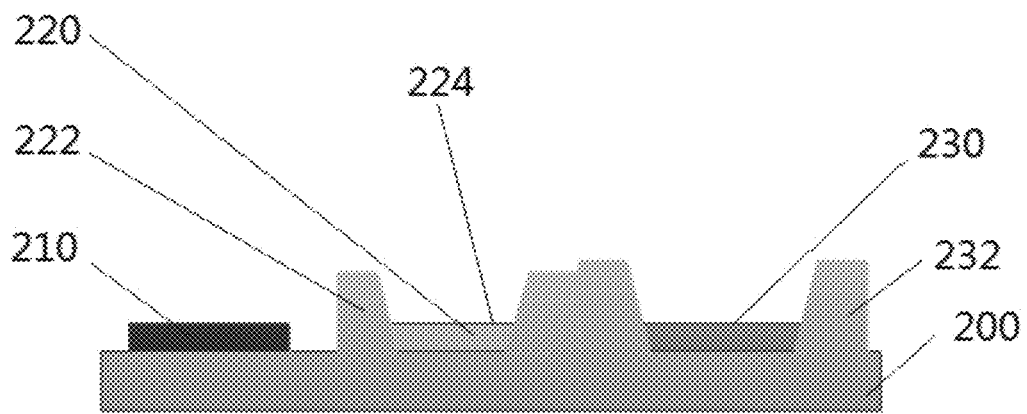
Figure 2E:
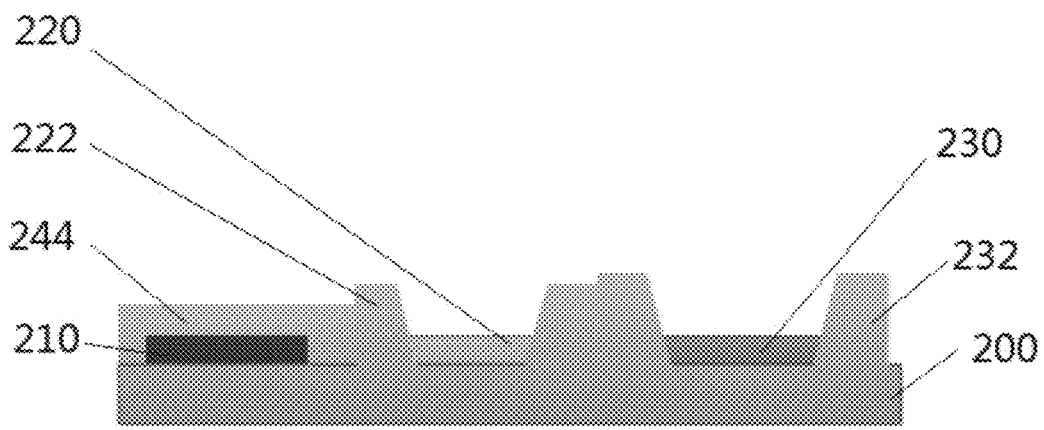
Figure 2F:
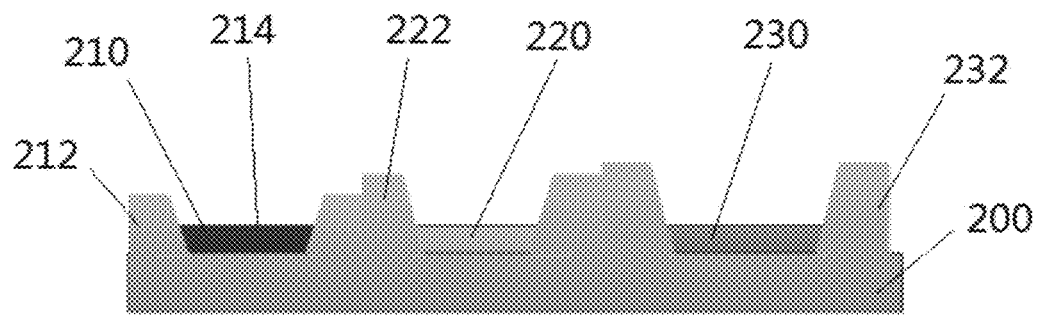
Figure 3:
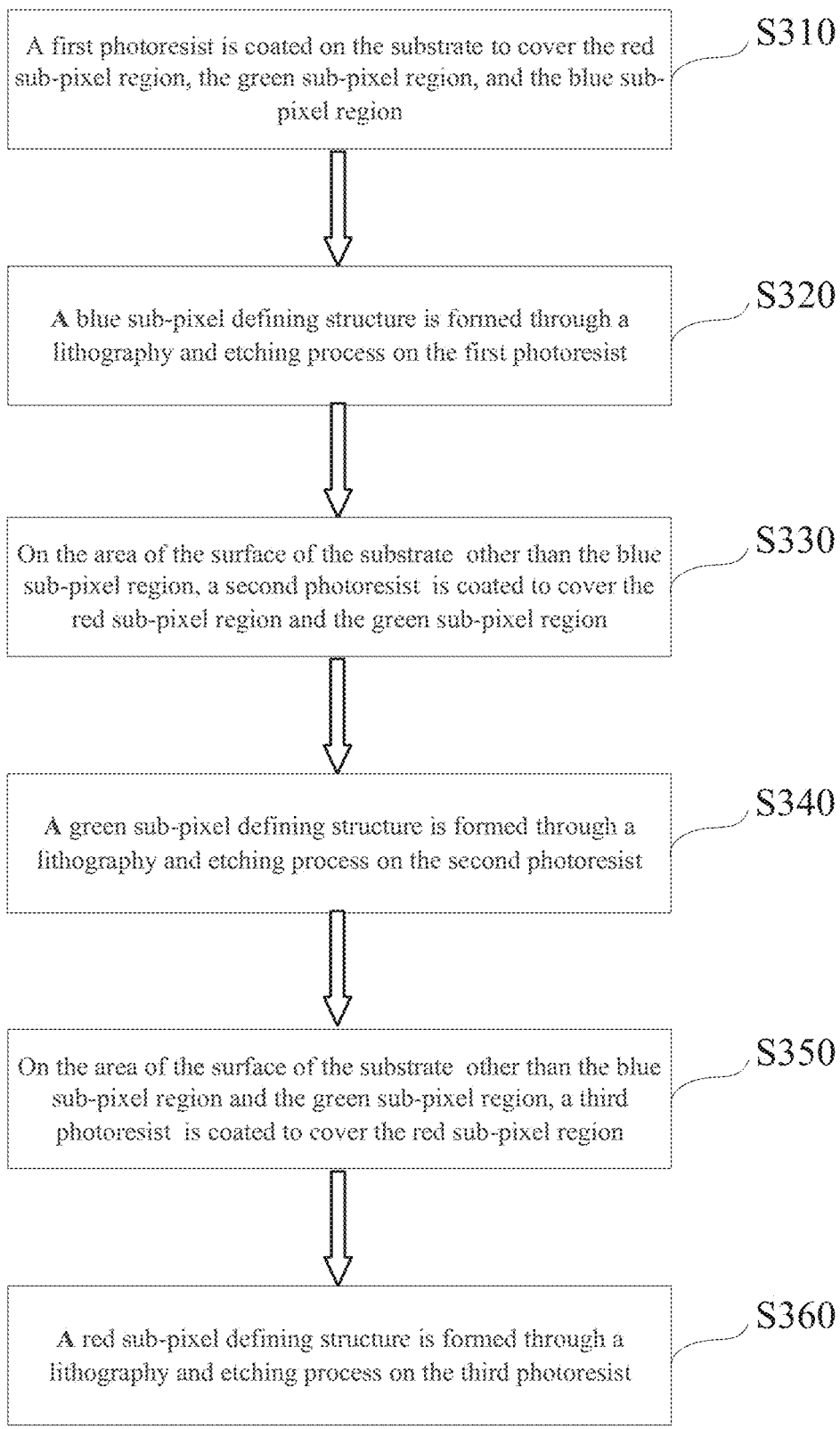
FIG. 3 is a flow chart of a method for manufacturing a pixel defining structure according to an arrangement of the present disclosure.

Next, a method for manufacturing the above-described pixel defining structure according to an exemplary arrangement of the present disclosure will be described with reference to FIGS. 2A-2F and FIG. 3. FIGS. 2A-2F are schematic cross-sectional views showing the structure of a pixel defining layer at each stage in the manufacturing process of the exemplary arrangement. FIG. 3 is a flow chart schematically showing a manufacturing method of the exemplary arrangement.

The method for manufacturing the pixel defining structure of this exemplary arrangement of the present disclosure includes block S310. Referring to FIG. 2A, in block S310, on the substrate 200 on which the first (red) sub-pixel driving structure 210, the second (green) sub-pixel driving structure 220, and the third (blue) sub-pixel driving structure 230 have been formed, first photoresist 240 is coated to cover the red sub-pixel driving structure 210, the green sub-pixel driving structure 220, and the blue sub-pixel driving structure 230, or in other words, to cover the red, green, and blue sub-pixel regions.

The first photoresist 240 is the same material as the blue sub-pixel defining structure 132, and includes, for example, a lyophilic material such as silicon oxide or silicon nitride, and a lyophobic material such as fluoropolyimide or fluorine-containing polymethyl methacrylate. During the film formation process, the lyophobic material will float on top, while the lyophilic material will sink below. The substrate 200 can be formed of a transparent material such as glass or polyimide known to those skilled in the art. The sub-pixel driving structures 210, 220, and 230 on the substrate 200 can be formed by various film forming processes such as deposition, evaporation, sputtering, coating, etc., which are well known to those skilled in the art, and can include, for example, an anode layer, a hole transport layer, and a hole injection layer.

The method of this exemplary arrangement of the present disclosure further includes block S320. Referring to FIG. 2B, in block S320, a corresponding blue sub-pixel region is formed around the blue sub-pixel driving structure 230.

In an exemplary arrangement, the portion of the first photoresist corresponding to the red and green sub-pixel regions can be removed with a first mask through a lithography and etching process, and only the portion of the first photoresist corresponding to the blue sub-pixel region is retained, such that the blue sub-pixel defining structure 232 is raised around the bottom 234 of the sub-pixel region, and the blue sub-pixel driving structure 230 forms the bottom 234 of the blue sub-pixel region.

The surface material of the blue sub-pixel driving structure 230 is either lyophilic per se or formed with a lyophilic coating. Therefore, the bottom 234 of the sub-pixel region has lyophilicity. Since the first photoresist 240 is a bifunctional material including a lyophilic material and a lyophobic material, after the formation of the film, the portion of the sub-pixel defining structure 232 of the blue sub-pixel close to the bottom 234 of the sub-pixel region, that is, the portion close to the substrate 200 has lyophilicity to form a lyophilic portion, and the portion far away from the bottom 234 of the sub-pixel region, that is, the portion far away from the substrate 200, is lyophobic to form a lyophobic sidewall portion.

The method of this exemplary arrangement of the present disclosure further includes block S330. Referring to FIG. 2C, in block S330, on the substrate 200 on which the first (red) sub-pixel driving structure 210 and the second (green) sub-pixel driving structure 220 have been formed, that is, on the area of the surface of the substrate 200 other than the blue sub-pixel region, a second photoresist 242 is coated to cover the red sub-pixel driving structure 210 and the green sub-pixel driving structure 220.

The second photoresist 242 is the same material as the green sub-pixel defining structure 122, such as a bifunctional material. The material of the second photoresist 242 can be the same as the first photoresist.

The method of this exemplary arrangement of the present disclosure further includes block S340. Referring to FIG. 2D, in block S340, a corresponding green sub-pixel region is formed around the green sub-pixel driving structure 220.

In an exemplary arrangement, the portion of the second photoresist corresponding to the red sub-pixel region can be removed with a second mask through a lithography and etching process, and only the portion of the second photoresist corresponding to the green sub-pixel region is retained, such that the green sub-pixel defining structure 222 is raised around the bottom 224 of the sub-pixel region, and the green sub-pixel driving structure 220 forms the bottom 224 of the green sub-pixel region.

The surface material of the green sub-pixel driving structure 220 is either lyophilic or formed with a lyophilic coating. Therefore, the bottom 224 of the green sub-pixel region has lyophilicity. The second photoresist 242 is a bifunctional material including a lyophilic material and a lyophobic material. Therefore, after the formation of the film, the sub-pixel defining structure 222 of the green sub-pixel includes a lyophilic portion close to the bottom 224 of the sub-pixel region, that is, close to the substrate 200, and a lyophobic portion far away from the bottom 224 of the sub-pixel region, that is, far away from the substrate 200.

The area of the bottom 224 of the green sub-pixel region is smaller than the area of the bottom 234 of the blue sub-pixel region.

The method of this exemplary arrangement of the present disclosure further includes block S350. Referring to FIG. 2E, in block S350, on the substrate 200 on which the first (red) sub-pixel driving structure 210 has been formed, that is, the area of the surface on the substrate 200 other than the blue sub-pixel region and the green sub-pixel region, a third photoresist 244 is coated to cover the red sub-pixel driving structure 210. The thickness of the third photoresist 244 is smaller than the thickness of the second photoresist 242.

The third photoresist 244 is the same material as the red sub-pixel defining structure 112, such as a bifunctional material. The material of the third photoresist 244 can be the same as the second photoresist 242 and/or the first photoresist 240.

The method of this exemplary arrangement of the present disclosure further includes block S360. Referring to FIG. 2F, in block S360, a corresponding red sub-pixel region is formed around the red sub-pixel driving structure 210.

In an exemplary arrangement, the third photoresist 244 can be subject to lithography and etching, such that the red sub-pixel defining structure 212 is raised around the bottom 214 of the sub-pixel region and the red sub-pixel driving structure 210 forms the bottom 214 of the red sub-pixel region.

The area of the bottom 224 of the red sub-pixel region is smaller than the area of the bottom 224 of the green sub-pixel region.

The surface material of the red sub-pixel driving structure 210 is either lyophilic per se or formed with a lyophilic coating. Therefore, the bottom 214 of the red sub-pixel region has lyophilicity. The third photoresist 244 is a bifunctional material including a lyophilic material and a lyophobic material, so that after the formation of the film, the sub-pixel defining structure 212 of the red sub-pixel includes a lyophilic portion close to the bottom 214 of the sub-pixel region and a lyophobic portion far away from the bottom 214 of the sub-pixel region.

Although in the exemplary arrangement shown in FIGS. 2A to 2F and FIG. 3, a blue sub-pixel region is first formed, then a green sub-pixel region is formed, and finally a red sub-pixel region is formed. However, the present disclosure is not limited to the order in which the color sub-pixel regions are formed. That is, according to the present disclosure, the blue sub-pixel region can be formed first, or the green sub-pixel region can be formed first, or the red sub-pixel region can be formed first. The sub-pixel regions of the other two colors can also be formed in any order.

In the method for manufacturing a pixel defining structure according to another arrangement of the present disclosure, on a surface of a substrate where a first sub-pixel driving structure, a second sub-pixel driving structure, and a third sub-pixel driving structure have been formed, a photoresist is coated to cover a first sub-pixel region, a second sub-pixel region and a third sub-pixel region. The photoresist is subject to lithography and etching with a mask to form a first sub-pixel defining structure, a second sub-pixel defining structure and a third sub-pixel defining structure. The surfaces of the sidewalls of the first sub-pixel defining structure, the second sub-pixel defining structure, and the third sub-pixel defining structure are processed, such that sidewall portions of the first sub-pixel defining structure, the second sub-pixel defining structure, and the third sub-pixel defining structure close to the bottom of the corresponding sub-pixel region have lyophilicity to form a lyophilic portion, and sidewall portions of the first sub-pixel defining structure, the second sub-pixel defining structure, and the third sub-pixel defining structure far away from the bottom of the corresponding sub-pixel region have lyophobicity to form a lyophobic portion. The area of the bottom of the first sub-pixel region is smaller than the area of the bottom of the second sub-pixel region, and the area of the bottom of the second sub-pixel region is smaller than the area of the bottom of the third sub-pixel region; the thickness of the lyophilic portion of the first sub-pixel defining structure is smaller than thickness of the lyophilic portion of the second sub-pixel defining structure, and the thickness of the lyophilic portion of the second sub-pixel defining structure is smaller than thickness of the lyophilic portion of the third sub-pixel defining structure.

The method for manufacturing a pixel-defining structure of a red-green-blue OLED is described above as an example. A more general method for manufacturing a pixel defining structure according to the present disclosure includes: forming a first sub-pixel defining structure surrounding a first sub-pixel region and a second sub-pixel defining structure surrounding a second sub-pixel region on one surface of the substrate. The first sub-pixel region is configured to form a first sub-pixel having a first color, the first sub-pixel defining structure includes a lyophilic portion located at the bottom of the first sub-pixel region and a lyophobic portion located at a side opposite to the bottom of the first sub-pixel region; the second sub-pixel region is configured to form a second sub-pixel having a second color, the second sub-pixel defining structure includes a lyophilic portion located at the bottom of the second sub-pixel region and a lyophobic portion located at a side opposite to the bottom of the second sub-pixel region. The second color is different from the first color, and the lyophilic portion of the first sub-pixel defining structure has a different thickness than the lyophilic portion of the second sub-pixel defining structure.

Specific arrangements of the present disclosure have been described above by way of example. However, those skilled in the art will appreciate that the features, structures, or characteristics described above can be combined in any suitable manner in one or more arrangements. In the above description, numerous specific details are set forth to provide a thorough understanding of the arrangements disclosed herein. A person skilled in the art can realize that the technical solutions disclosed in the present application can be implemented without one or more specific details, or other methods, components, devices, blocks, and the like can be employed to implement the technical solutions disclosed in the present application.

It should be noted that the above arrangements are only used to illustrate the technical solutions of the present disclosure and do not limit the scope of the disclosure. While the present disclosure has been described in detail with reference to the specific arrangements thereof, it should be understood by those skilled in the art that the arrangements of the present disclosure can be modified or substituted for equivalent features without departing from the spirit and scope of the present disclosure. The present application is intended to cover any variations, usages, or adaptations of the present disclosure, which are according to the general principles of the disclosure and include common general knowledge or conventional technical means in the art that are not disclosed in the present application. The specification and examples are to be regarded as illustrative only, and the true scope and spirit of the present disclosure is indicated by the claims.

What is claimed is:

1. A display panel, comprising:
   a substrate comprising an anode layer, a hole transport layer, and a hole injection layer, and
   a pixel defining structure forming on one surface of the substrate and for defining a plurality of sub-pixels, the pixel defining structure comprising:
   a first sub-pixel defining structure surrounding a first sub-pixel region, wherein the first sub-pixel region has a first color, the first color is red, the first sub-pixel defining structure comprises a lyophilic portion and a lyophobic portion, and the lyophobic portion of the first sub-pixel defining structure is further away from the substrate than the lyophilic portion of the first sub-pixel defining structure away from the substrate; and
   a second sub-pixel defining structure surrounding a second sub-pixel region, wherein the second sub-pixel region has a second color, the second color is green, the second sub-pixel defining structure comprises a lyophilic portion and a lyophobic portion, and the lyophobic portion of the second sub-pixel defining structure is further away from the substrate than the lyophilic portion of the second sub-pixel defining structure away from the substrate;
   wherein an area of the first sub-pixel region is less than an area of the second sub-pixel region, and a thickness of the lyophilic portion of the first sub-pixel defining structure is less than a thickness of the lyophilic portion of the second sub-pixel defining structure, and
   wherein a first sub-pixel driving structure for driving a first sub-pixel and a second sub-pixel driving structure for driving a second sub-pixel are formed on said surface of the substrate, and the first sub-pixel driving structure and the second sub-pixel driving structure respectively form the bottom of the first sub-pixel region and the bottom of the second sub-pixel region.

2. The pixel display panel according to claim 1, wherein a thickness of the first sub-pixel defining structure is less than a thickness of the second sub-pixel defining structure.

3. A method for manufacturing a pixel defining structure, comprising:
   forming a first sub-pixel defining structure surrounding a first sub-pixel region and a second sub-pixel defining structure surrounding a second sub-pixel region on one surface of a substrate, wherein the substrate comprises an anode layer a hole transport layer and a hole injection layer,
   wherein
   the first sub-pixel region has a first color, the first color is red, the first sub-pixel defining structure comprises a lyophilic portion and a lyophobic portion, the lyophobic portion of the first sub-pixel defining structure is further away from the substrate than the lyophilic portion of the first sub-pixel defining structure away from the substrate, the second sub-pixel region has a second color, the second color is green, the second sub-pixel defining structure comprises a lyophilic portion and a lyophobic portion, the lyophobic portion of the second sub-pixel defining structure is further away from the substrate than the lyophilic portion of the second sub-pixel defining structure away from the substrate, an area of the first sub-pixel region is less than an area of the second sub-pixel region and a thickness of the lyophilic portion of the first sub-pixel defining structure is less than a thickness of the lyophilic portion of the second sub-pixel defining structure.

4. The method for manufacturing a pixel defining structure according to claim 3, wherein forming a first sub-pixel defining structure surrounding a first sub-pixel region and a second sub-pixel defining structure surrounding a second sub-pixel region on one surface of a substrate comprises:

coating a first photoresist comprising a lyophilic material and a lyophobic material on said surface of the substrate, to cover the first sub-pixel region and the second sub-pixel region, performing lithography and etching on the first photoresist to form the first sub-pixel defining structure surrounding the first sub-pixel region, coating a second photoresist comprising a lyophilic material and a lyophobic material on said surface of the substrate, to cover the second sub-pixel region, the thickness of the second photoresist is larger than the thickness of the first photoresist, and performing lithography and etching on the second photoresist to form the second sub-pixel defining structure surrounding the second sub-pixel region.

5. The method for manufacturing a pixel defining structure according to claim 3, wherein forming a first sub-pixel defining structure surrounding a first sub-pixel region and a second sub-pixel defining structure surrounding a second sub-pixel region on one surface of a substrate comprises:

coating a first photoresist comprising a lyophilic material and a lyophobic material on said surface of the substrate, to cover the first sub-pixel region and the second sub-pixel region, performing lithography and etching on the first photoresist to form the second sub-pixel defining structure surrounding the second sub-pixel region, coating a second photoresist comprising a lyophilic material and a lyophobic material on said surface of the substrate, to cover the first sub-pixel region, the thickness of the second photoresist is smaller than the thickness of the photoresist, and performing lithography and etching on the first photoresist to form the first sub-pixel defining structure surrounding the second sub-pixel region.

6. The method for manufacturing a pixel defining structure according to claim 3, wherein forming a first sub-pixel defining structure surrounding a first sub-pixel region and a second sub-pixel defining structure surrounding a second sub-pixel region on one surface of a substrate comprises:

coating a photoresist on said surface of the substrate, to cover the first sub-pixel region and the second sub-pixel region, performing lithography and etching on the photoresist to form the first sub-pixel defining structure and the second sub-pixel defining structure of the same thickness, performing surface processing on the surface of the sidewall of the first sub-pixel defining structure, such that the portion of the first sub-pixel defining structure close to the substrate has a lyophilic sidewall surface, to form a lyophilic portion of the first sub-pixel defining structure, and the portion of the first sub-pixel defining structure far away from the substrate has a lyophobic sidewall surface, to form a lyophobic portion of the first sub-pixel defining structure, and performing surface processing on the surface of the sidewall of the second sub-pixel defining structure, such that the portion of the second sub-pixel defining structure close to the substrate has a lyophilic sidewall surface, to form a lyophilic portion of the second sub-pixel defining structure, and the portion of the second sub-pixel defining structure far away from the substrate has a lyophobic sidewall surface, to form a lyophobic portion of the second sub-pixel defining structure.

7. A display panel comprising a substrate and a pixel defining structure according to claim 3, forming on one surface of the substrate, wherein a first sub-pixel driving structure for driving a first sub-pixel and a second sub-pixel driving structure for driving a second sub-pixel are formed on said surface of the substrate, and the first sub-pixel driving structure and the second sub-pixel driving structure respectively form the bottom of the first sub-pixel region and the bottom of the second sub-pixel region.

8. A display device comprising the display panel according to claim 1.

9. A display device comprising the display panel according to claim 2.

10. A display device comprising the display panel according to claim 7.

* * * * *